United States Patent
Pietkiewicz et al.

(10) Patent No.: US 8,115,571 B2
(45) Date of Patent: Feb. 14, 2012

(54) HARMONIC FILTER

(75) Inventors: Andrzej Pietkiewicz, Burgdorf (CH);
Fabian Beck, Rüttenen (CH)

(73) Assignee: Schaffner EMV AG, Luterbach (CH)

( * ) Notice: Subject to any disclaimer, the term of this patent is extended or adjusted under 35 U.S.C. 154(b) by 171 days.

(21) Appl. No.: 12/325,043

(22) Filed: Nov. 28, 2008

(65) Prior Publication Data

US 2010/0134204 A1   Jun. 3, 2010

(51) Int. Cl.
*H03H 7/01* (2006.01)

(52) U.S. Cl. ........ 333/175; 333/167; 333/172; 333/176; 333/181

(58) Field of Classification Search .................. 333/167, 333/170, 171, 172, 175, 176, 181, 185
See application file for complete search history.

(56) References Cited

U.S. PATENT DOCUMENTS

| | | | | |
|---|---|---|---|---|
| 3,858,138 | A * | 12/1974 | Gittleman et al. | 336/136 |
| 4,034,325 | A * | 7/1977 | Zarkov | 336/75 |
| 5,530,396 | A * | 6/1996 | Vlatkovic et al. | 327/552 |
| 6,356,182 | B1 * | 3/2002 | Nagashima | 336/200 |
| 7,064,624 | B2 * | 6/2006 | Poirier et al. | 333/12 |

OTHER PUBLICATIONS

International Standard Publication IEC 61000-3-12 Electromagnetic compatibility (EMC) Part 3-12: Limits-Limits for harmonic currents produced by equipment connected to public low-voltage systems with input current >16 A and ≤75 A per phase, First edition, 2004-11 (c) IEC 2004, pp. 1-63.
International Standard Publication IEC 61000-4-2 Electromagnetic compatibility (EMC)—Part 4-2: *Testing and measurement techniques—Electrostatic discharge immunity test*, Editiion 2.0 2008-12 (c) IEC 2008, pp. 1-64.

* cited by examiner

*Primary Examiner* — Robert Pascal
*Assistant Examiner* — Kimberly Glenn
(74) *Attorney, Agent, or Firm* — Blank Rome LLP

(57) ABSTRACT

A Passive harmonic filter (F) has an input node (B) for connection to a power supply (1), an output node (C) for connection to a load (15, 17) and an intermediate node (A). A first branch (3, 4) located between the input node (B) and the intermediate node (A) has at least one first inductance (4). A second branch (11, 13) located between the intermediate node (A) and the output node (C) has at least one second inductance (11). A third branch (5, 7, 9) is connected to the intermediate node (A) and has at least one capacitor (9). The first, second and third branch thus build a low-pass T-filter. A damping branch (22, 24) is provided having at least one first resistor (22), where the damping branch is arranged in parallel to the first branch.

12 Claims, 14 Drawing Sheets

HARMONIC FILTER

FIELD OF THE INVENTION

The present invention concerns a harmonic filter for filtering harmonic currents and voltages in an electric power system.

DESCRIPTION OF RELATED ART

Harmonics are electric voltages and currents that appear on the electric power system as a result of certain kinds of electric loads. Harmonic currents and voltages in the power network are a frequent cause of power quality problems.

When a non-linear load, such as a rectifier, an uninterruptible power supply, a computer etc, is connected to a power system, it draws a current that is generally not sinusoidal. Using Fourier series analysis, and assuming this current is periodic, it can be decomposed into a sum of simple sinusoids, which start at the fundamental power system frequency (first harmonic—typically 50 Hertz in Europe and 60 Hertz in the US) and occur at integer multiples of this fundamental frequency. The sinusoid having a frequency which is n-tuple of the fundamental frequency is called the n-th harmonic.

Harmonics in a power system generally cause an unwanted increase of the current in the system. In addition, different pieces of electrical equipment can suffer effects from harmonics on the power system. For example, electric motors experience hysteresis losses may be caused by eddy currents set up in the iron core of the motor. This results in increased heating of the motor core, which (if excessive) can shorten the life of the motor.

Harmonics may also produce vibrations and increase noise levels. They may further cause malfunction and fault conditions in communication lines and in electronic circuits.

In order to achieve the level of harmonics required by those standards, harmonics filters are widely used. Passive harmonic filters are especially common for reducing harmonics between 50 Hz (60 Hz) and a few Kilohertz. For reliable industrial power distribution, the fifth harmonic at 250 Hz (in Europe) and the seventh harmonic at 350 Hz (Europe) are of primary concern. Thus, many common harmonic filters are designed especially for effective reduction of those harmonics, and/or of the third harmonic in case of a system with a neutral conductor.

An example of a system with a passive harmonic filter FP is illustrated on FIG. 1. The filter FP is connected between an AC power source 1 and a load 15-17. The illustrated filter has a T structure with three branches: the first branch between the node B connected to a power source and an intermediate node A is traversed by a current $I_{Line}$, the second branch with a current $I_{Rect}$ is between the node A and an output node C connected to the load, and the third branch with a current $I_{Trap}$ is between the intermediate node A and the ground.

In the illustrated example, the first branch comprises an inductance 4 with its parasitic resistance 3. The second branch comprises another inductance 11 with its parasitic resistance 13. The third branch comprises an optional third inductance 5 with its parasitic resistance 7 and a capacitor 9. The values of the components in the different branches are selected so that the fundamental frequency component of the current $I_{Rect}$ flows through the first and second branch (circuit R2), while the higher harmonics are trapped by the third branch and thus do not reach the power supply 1 (circuit R1).

This is, of course, only a rough approximation. FIG. 2 is a frequency characteristic diagram illustrating the gain $I_{Line}/I_{Rect}$ of the harmonic filter of FIG. 1 as a function of the frequency, both shown on a logarithmic scale. The attenuation of the fifth and higher harmonics can clearly be seen, as well as resonant effects.

FIG. 3 illustrates the amplitude A of each harmonic of the current $I_{line}$ when this harmonic filter is used with a typical load, such as a six-diode rectifier in a three phase application for example.

The harmonic filter illustrated on FIG. 1-3 has a number of drawbacks:

(1) This filter is highly effective for reducing the harmonics 5, but not so much against higher harmonics. This is not always satisfactory, and in fact most demanding standards, including but not limited to DIN EN61000-4-2, DIN EN61000-3-12 and IEEE519-1992, define authorized thresholds for those harmonics, as illustrated by the lines $t_{5-7}$, $t_{11-13}$, ..., $t_i$ on FIG. 3. As can be seen, the harmonic filter of FIG. 1 easily meets the requirements of those standards for harmonics 5 and 7, but barely meets those requirements at the eleventh harmonic for example (at 550 Hz in Europe, or 660 Hz in the USA).

(2) Furthermore, those limits are only met when the passive harmonic filter of FIG. 1 is directly connected to a non linear load such as a six diode rectifier, as in the example of FIG. 1. However, in many setups, an additional passive filter, such as a radiofrequency filter (RFI, EMC or EMI filter) is mounted between the harmonic filter and the non linear load, in order to cancel symmetric and/or asymmetric perturbations at higher frequencies, for example perturbations between 10 Kilohertz and a few Megahertz. Viewed from the harmonic filter, this additional radiofrequency filter is in first approximation equivalent to an additional capacitance 19 between the output node B of the harmonic filter and the ground, as illustrated on FIG. 4. This capacitive branch 19 creates additional resonances with inductances 4,5,11 and changes the frequency characteristic of FIG. 2 into the frequency characteristic of FIG. 5. The parasitic resistances 3 and 13 have low value (for example less than one Ohm) so that the undesired frequency components are almost not attenuated.

This capacitive branch 19 thus creates resonance which amplifies harmonics at intermediate frequencies, as illustrated in the diagram of FIG. 5 and on the chart of FIG. 6. Especially the harmonics 17, 19, 25, 29, 31, 35, 37 are above the limits set by the above mentioned standards.

BRIEF SUMMARY OF THE INVENTION

Accordingly, a general object of the present invention is to provide a passive harmonic filter that is more effective against the eleventh harmonic than the filter of FIG. 1, while still meeting the requirements set by the standards for other harmonics.

Another object of the present invention is to provide a passive harmonic filter that is more effective against higher harmonics when combined with a RFI filter.

According to one aspect of the invention, these objectives are solved by providing a passive harmonic filter comprising one damping branch arranged for damping resonant currents which are generated when a RFI filter is connected at the output of a harmonic filter.

According to another aspect of the invention, these objectives are achieved by providing a passive harmonic filter comprising:
an input node for connection to a power supply;
an output node for connection to a load;
an intermediate node;

a first branch between said input node and said intermediate node, said first branch comprising at least one first inductance;

a second branch between said intermediate node and said output node, said second branch comprising at least one second inductance;

a third branch between said intermediate node and the ground, and comprising at least one capacitor;

said first, second and third branch thus building a low-pass T-filter;

a damping branch comprising at least one first resistor, said damping branch being arranged in parallel to said first branch.

The additional damping branch thus provides an additional damping path for the current, so that at least a part of this current avoids the additional resonant loops created by the capacitor at the input of the RFI filter. Current in this additional path does not resonate, and is further damped by the resistor.

The damping branch slightly reduces the damping efficiency of the harmonic filter at higher frequencies (>2.5 Kilohertz) and partly for this reason was not considered before. However, at those higher frequencies, the circuit of FIG. 1 already more than fulfills the expectations of standards, so that a small loss of damping efficiency at high frequency is not a problem for most applications.

In the following description and in the claims, the expression "between two nodes" means "mounted anywhere in an electric path between those two nodes". For example, a branch or a component "between the nodes A and B" does not mean that the branch or component is immediately connected to either A, or B, nor that this branch or component is physically located between A and B; rather, the expression merely means that at least one electric path between A and B crosses this branch or component.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 7:
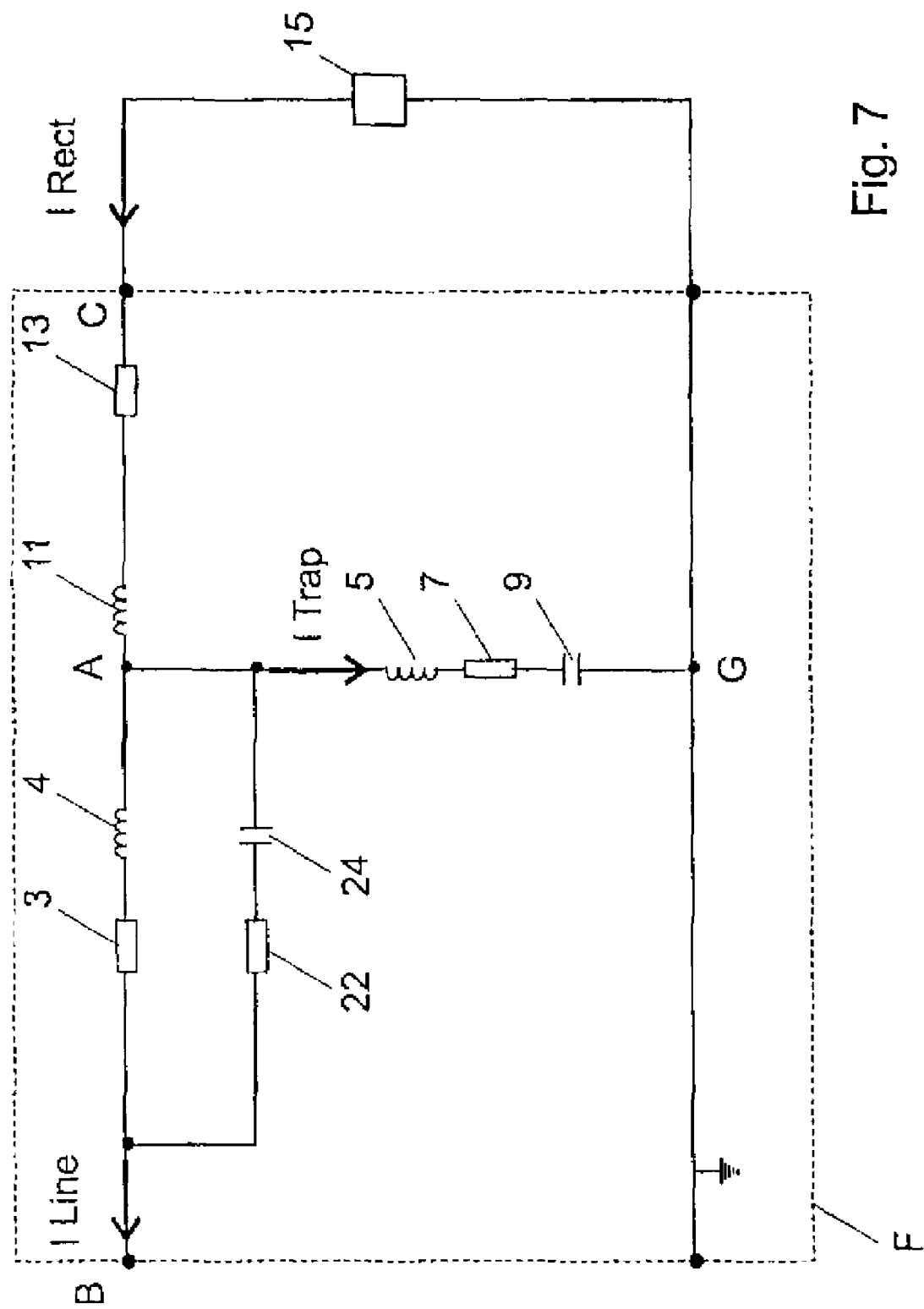
FIG. 7 shows a system comprising a harmonic filter according to a first embodiment of the invention, mounted between a power supply and a load.

A first embodiment of harmonic filter F according to an aspect of the invention is illustrated in FIG. 7. The filter F is connected between an AC power source 1, such as the network, and a load 15-17. It comprises an input node B for connecting to a current conducting phase of the power supply, an output node C for connecting to a current conducting phase of the load, and a node G for connection to the ground of the load and of the power supply system.

The harmonic filter of this embodiment is a low-pass T-filter having three main branches:

a) A first branch 3, 4 between the input node B and an intermediate node A. This first branch is preferably mainly inductive and comprises an inductance 4, for example a discrete coil, with its parasitic resistor 3. The resistor 4 may also be a discrete resistor, or may only use resistive losses of the inductance 4. The value of the resistor may increase with the frequency.

b) A second branch 11, 13 between the intermediate node A and the output node C. This second branch is mainly inductive and comprises an inductance 11, for example a discrete coil, with its parasitic resistor 13. The resistor 13 may also be a discrete resistor, or may only use resistive losses of the inductance 11. Again, the value of the resistor may increase with the frequency.

c) A third branch ("trap branch") building the leg of the T-filter and connected to the intermediate node A and to the point G, preferably the ground. This third branch is mainly capacitive and comprises a capacitor 9. In one preferred embodiment, this third branch also comprises a resistor 7 for damping the current $I_{Trap}$ through this branch. In a preferred embodiment, this third branch further comprises an inductance 5, for example a discrete coil. Again, the resistor 7 may be a discrete resistor, or may use resistive losses of the inductance 5. However, the value of the resistor preferably does not increase with the frequency, or does not increase as fast as the value of the other resistors 3 and/or 13.

The different coils 4, 5 and 11 may be wound around a single core in order to reduce cost and volume. However, in a preferred embodiment, those coils are wound around different cores, in order to adapt to the properties of each core conforming to the requirements for each coil. In an example, the different coils may have cores made up of different materials. For example, the inductance 4 at input may have a relatively cheap iron node, because most current through this inductance is at a relatively low fundamental frequency. Such a cheap iron core has the further benefit of higher losses at high frequency, thus also contributing to the attenuation of higher harmonics. On the other hand, the inductance 5 in the third branch preferably uses a more expensive core with less loss, because this branch will mainly be used for trapping harmonics at higher frequencies.

In order to improve attenuation of the eleventh harmonic, and to solve the other above mentioned problems, the harmonic filter of the invention comprises an additional damping branch 22, 24. In the embodiment of FIG. 7, this branch is mounted in parallel to the first branch, i.e., between the input node B on one side and the intermediate node on the other side.

The additional damping branch 22, 24 illustrated in FIG. 7 comprises a resistor 22 and an optional capacitor 24. It allows at least some spectral components of the current to bypass the inductance 4 and thus avoids at least some undesired resonant effects. At high frequencies, this damping branch also reduces the voltage difference between nodes A and B and thus limits the effect of inductance 4.

Figure 1:
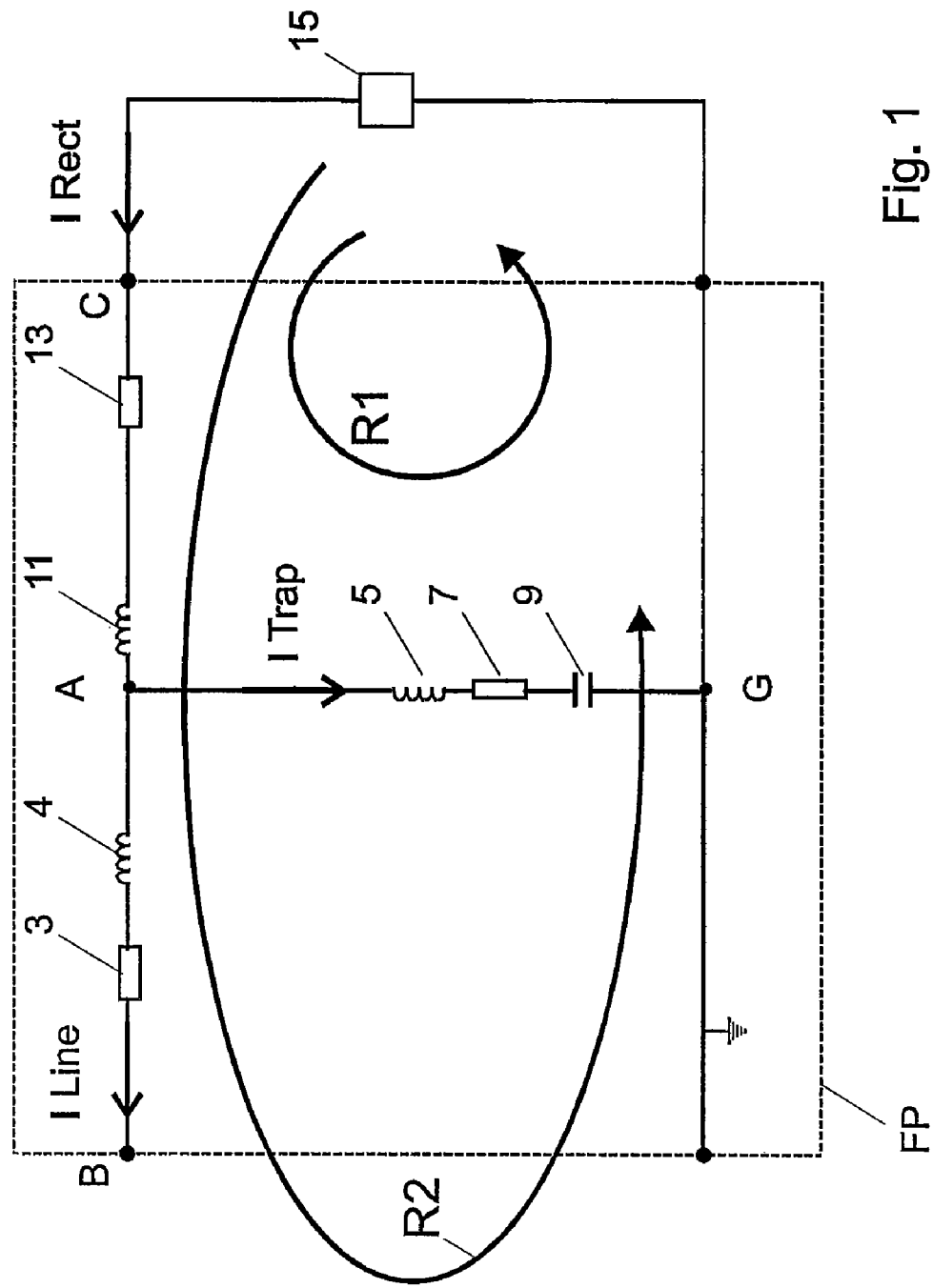
FIG. 1 shows a system comprising a harmonic filter mounted between a power supply and a load.
Figure 2:
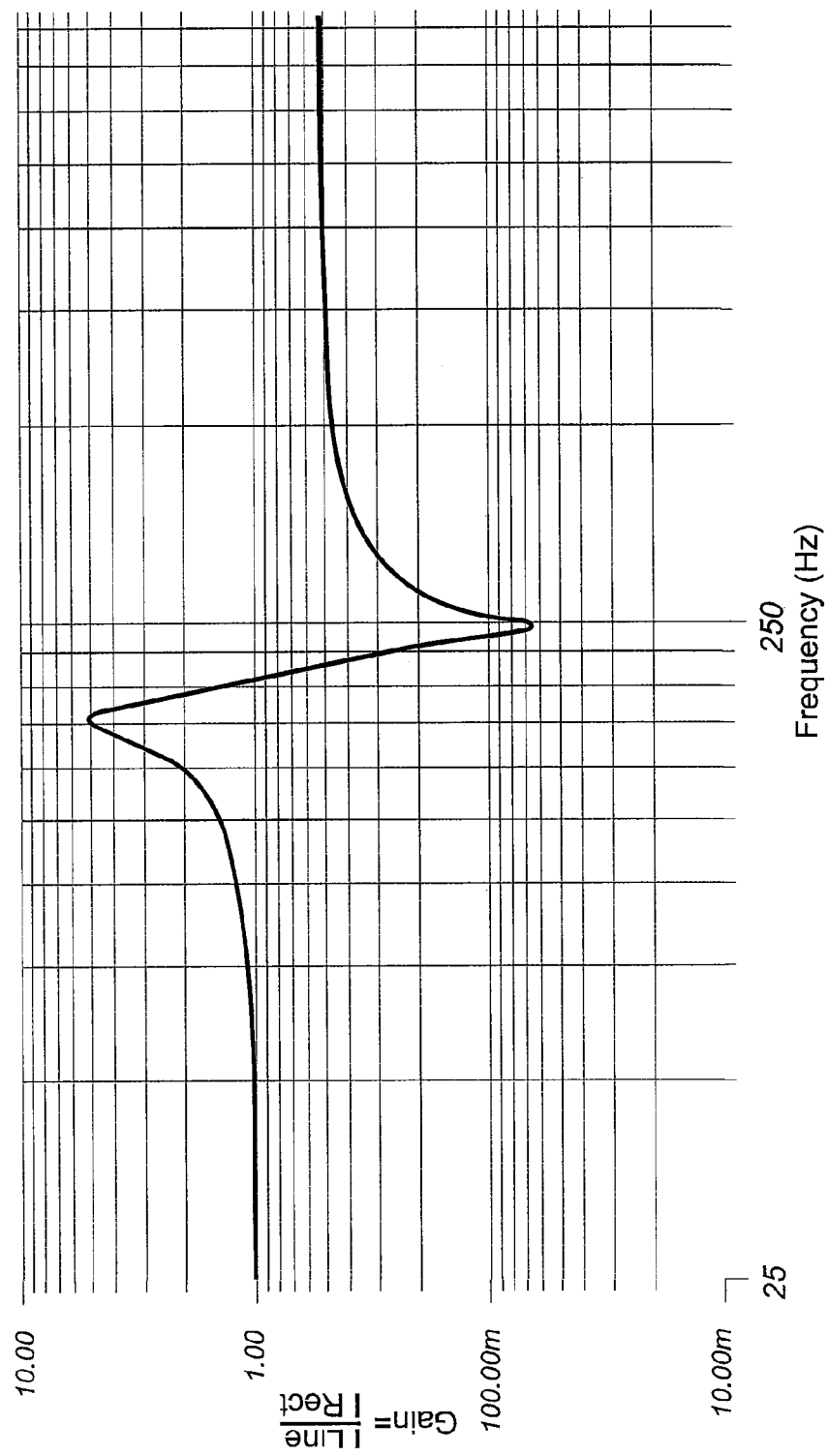
FIG. 2 is a frequency characteristic diagram showing the gain of the harmonic filter of FIG. 1 as a function of the frequency, both illustrated on a logarithmic scale.
Figure 3:
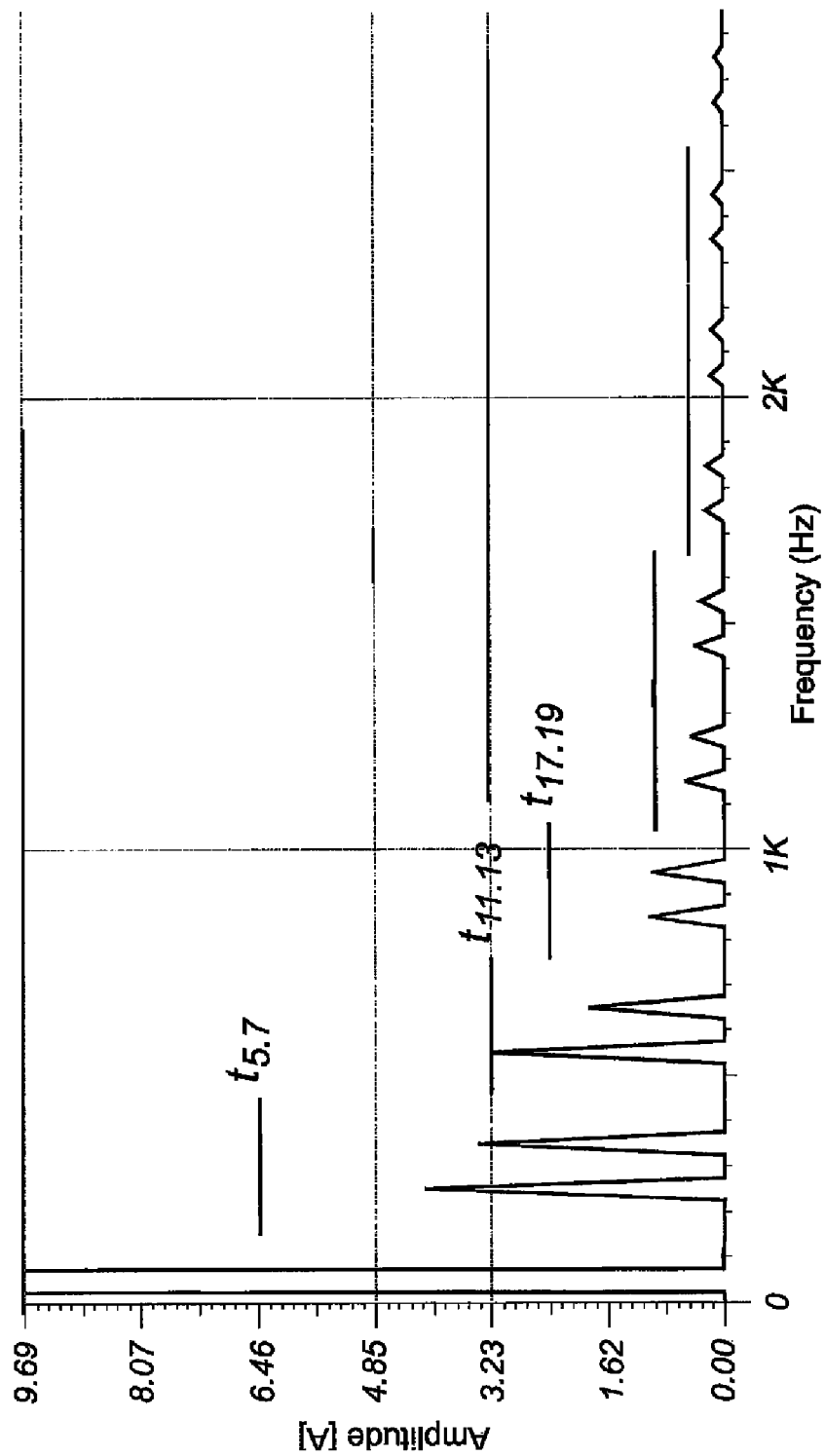
FIG. 3 is a graph showing the amplitude of the current at each harmonic for the harmonic filter of FIG. 1 loaded by six-diode rectifier as a function of the frequency illustrated on a linear scale.
Figure 4:
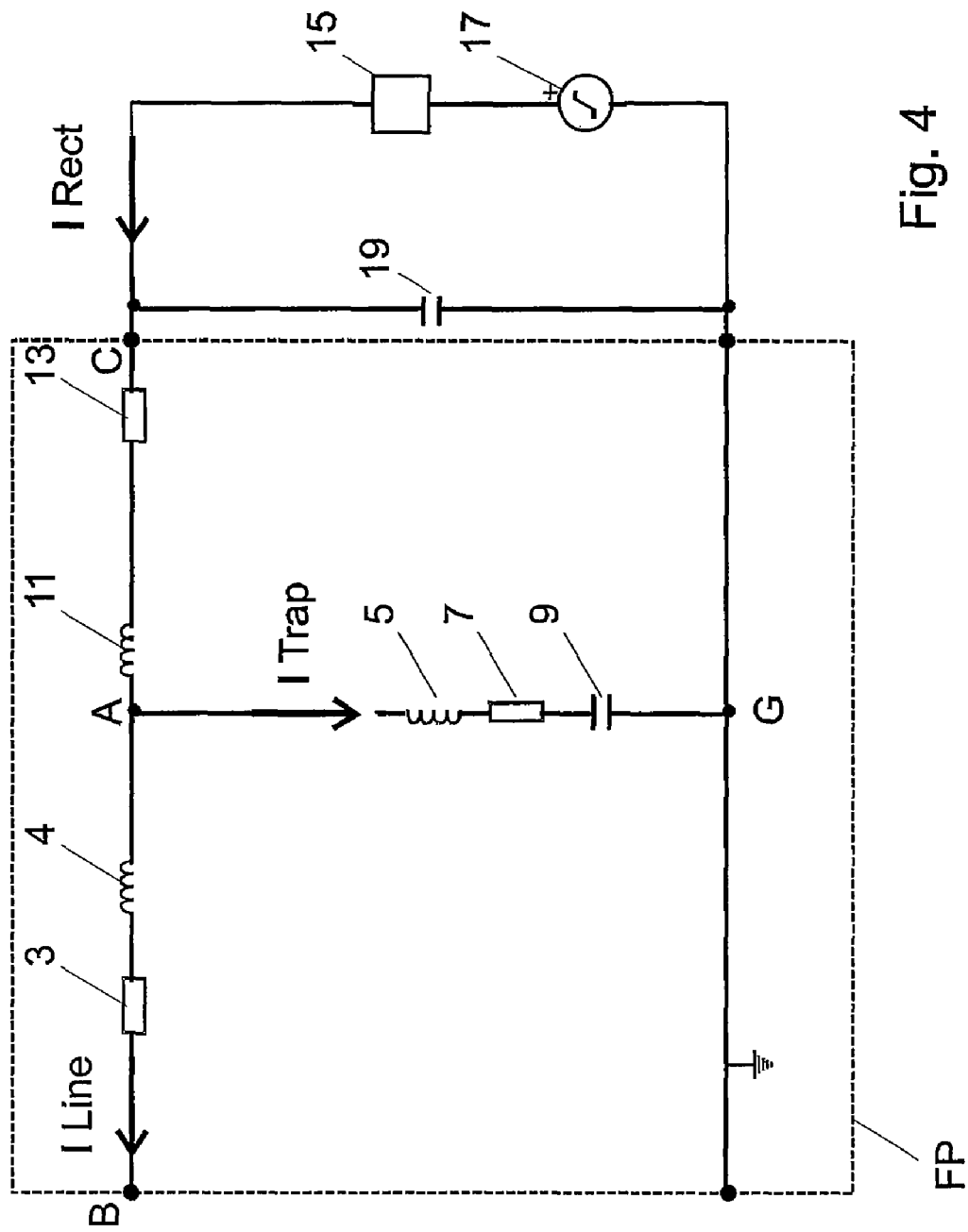
FIG. 4 shows a system comprising the harmonic filter of FIG. 1, mounted between a power supply and a load, wherein the load comprises a RFI filter.
Figure 5:
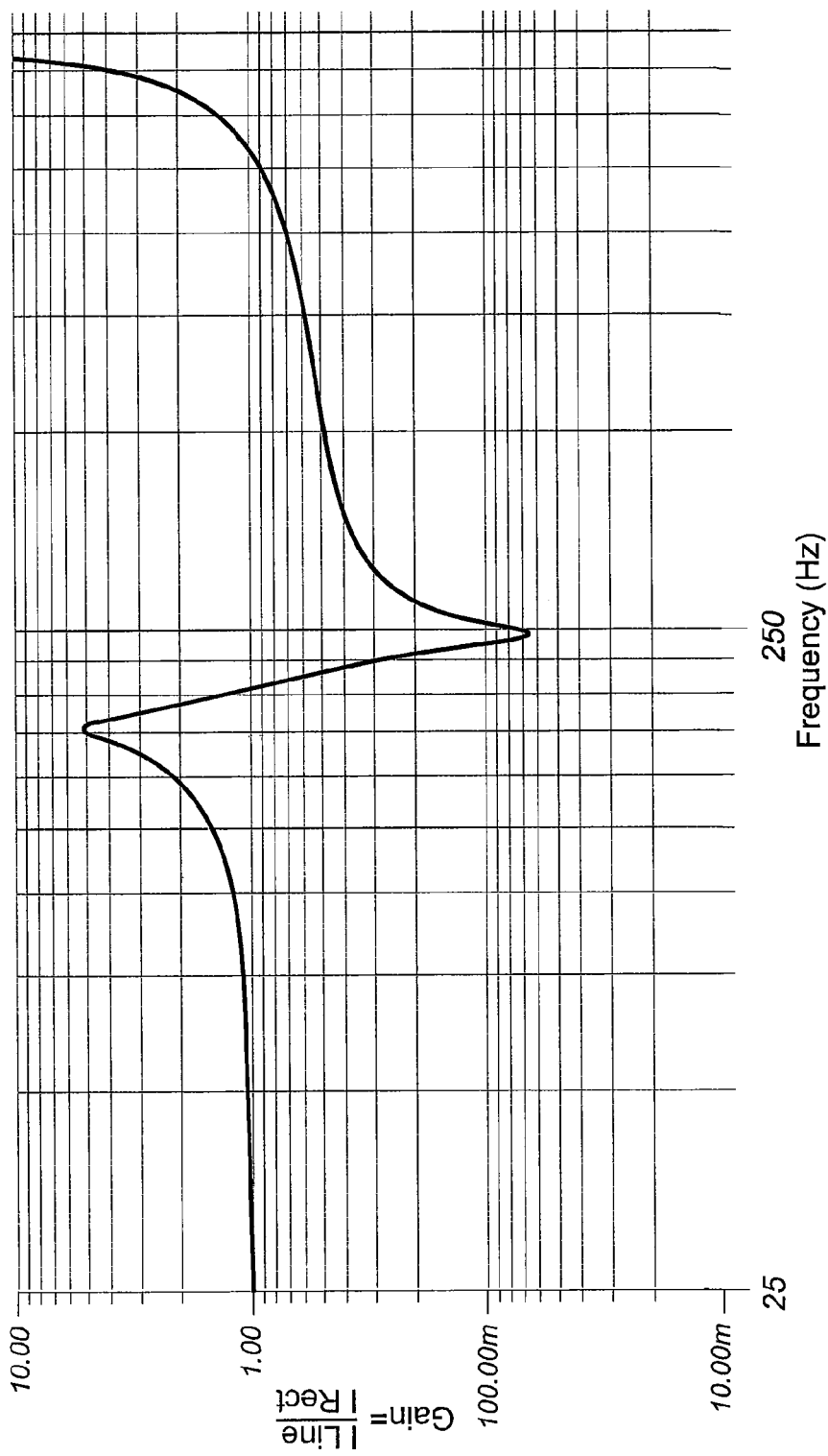
FIG. 5 is a frequency characteristic diagram showing the gain of the harmonic filter of FIG. 4 as a function of the frequency, both illustrated on a logarithmic scale.
Figure 6:
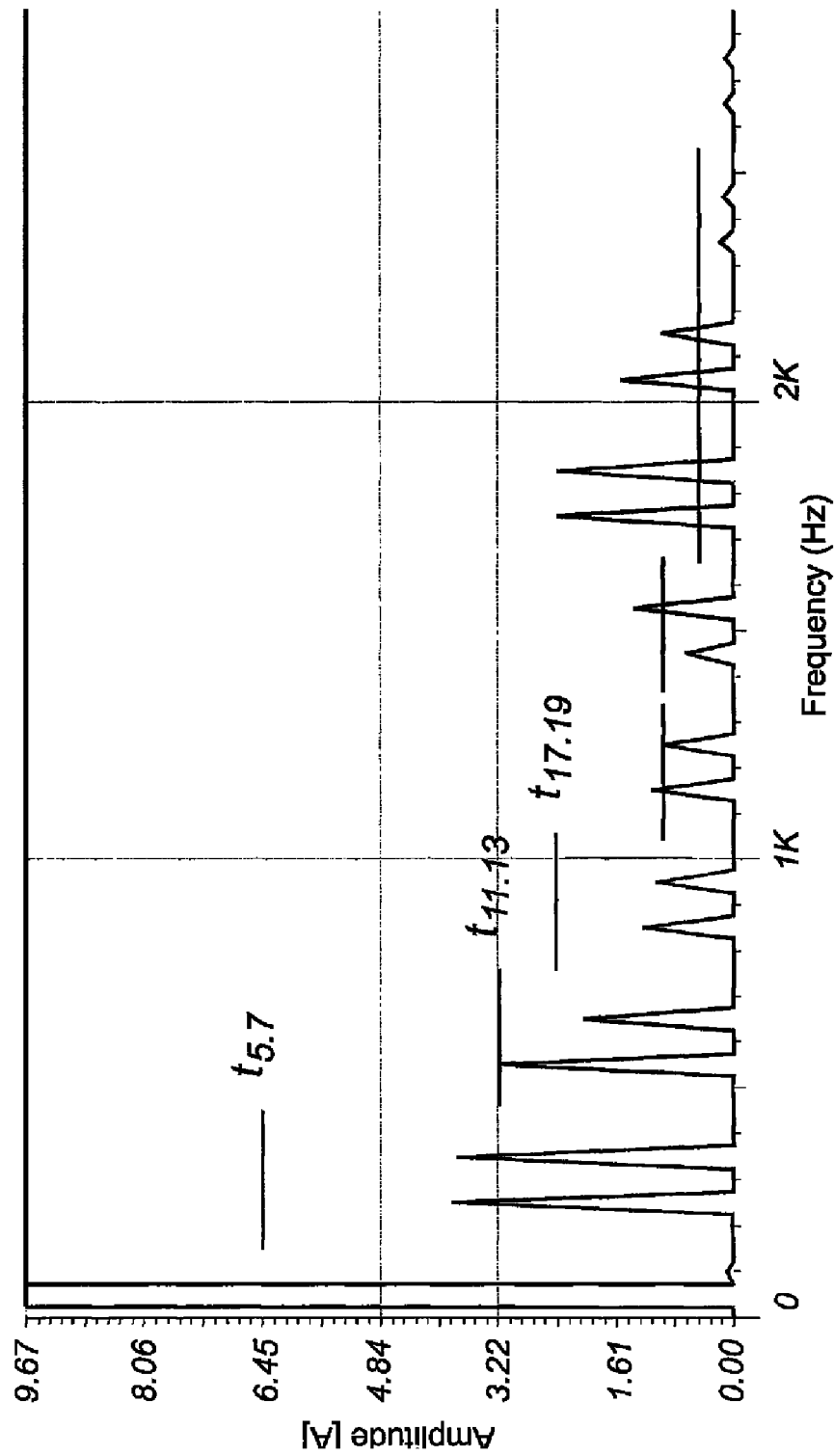
FIG. 6 is a graph showing the amplitude of the current at each harmonic for the harmonic filter of FIG. 4 loaded by six-diode rectifier as a function of the frequency illustrated on a linear scale.
Figure 8:
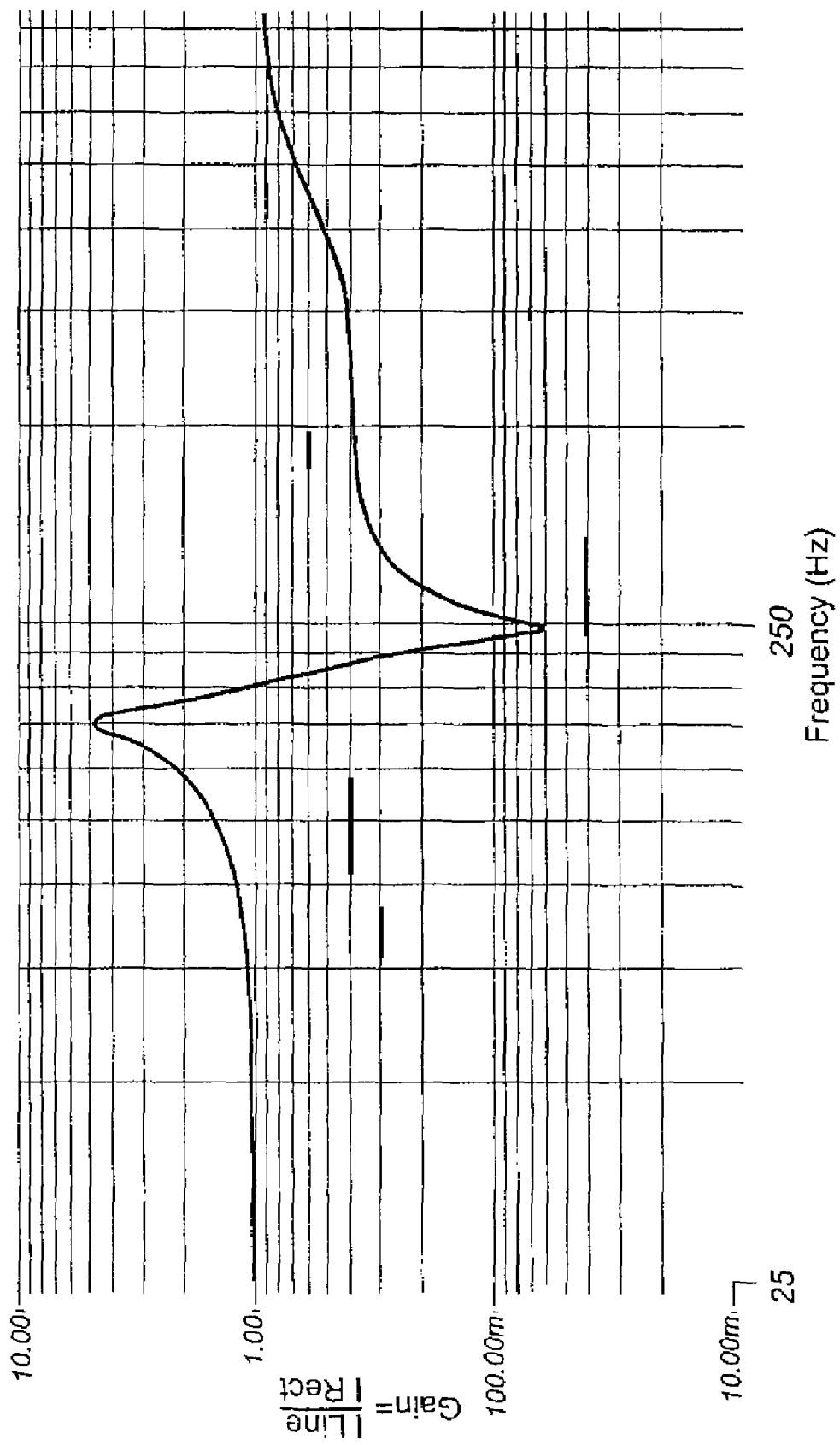
FIG. 8 is a frequency characteristic diagram showing the gain of the harmonic filter of FIG. 7 as a function of the frequency, both illustrated on a logarithmic scale.
Figure 9:
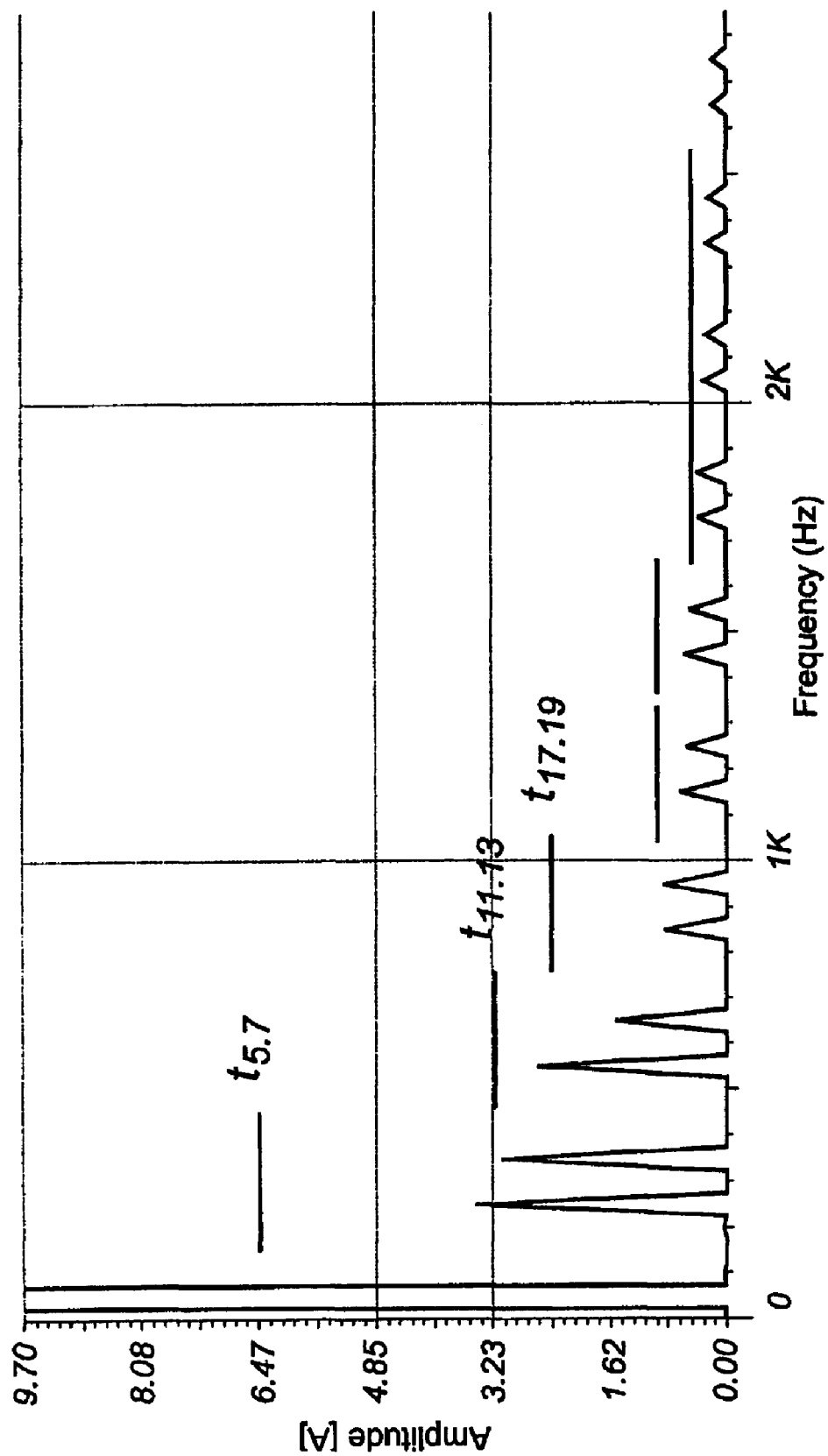
FIG. 9 is a graph showing the amplitude of the current at each harmonic for the harmonic filter of FIG. 7 loaded by six-diode rectifier as a function of the frequency illustrated on a linear scale.

The effect of this additional damping branch on the gain of the filter and on the amplitude of the harmonics is illustrated in FIGS. 8 and 9. As can be seen, attenuation of the eleventh harmonic, is now better than with the circuit of FIG. 1.

Figure 10:
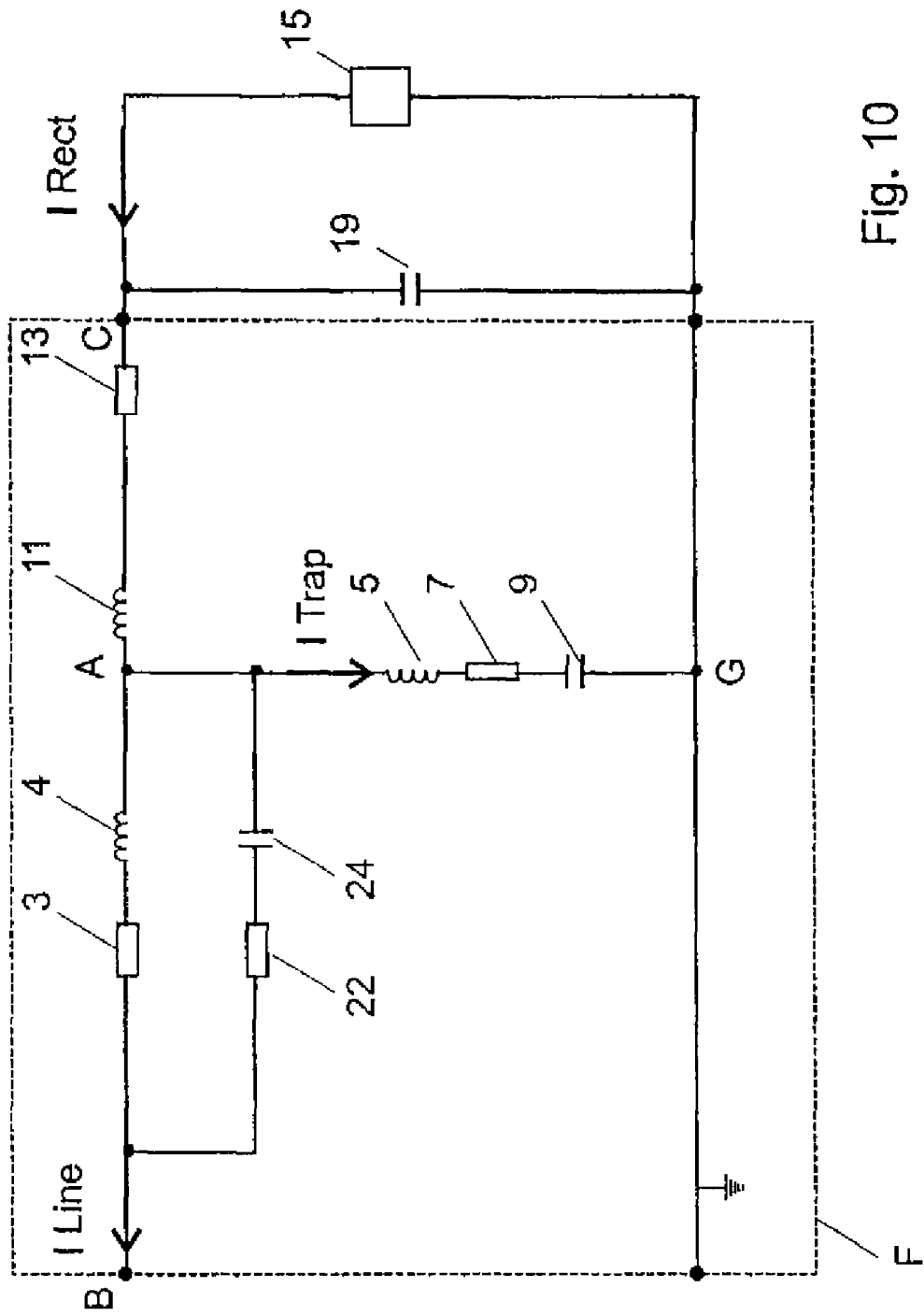
FIG. 10 shows a system comprising the harmonic filter of FIG. 7, mounted between a power supply and a load, wherein the load comprises a RFI filter.
Figure 11:
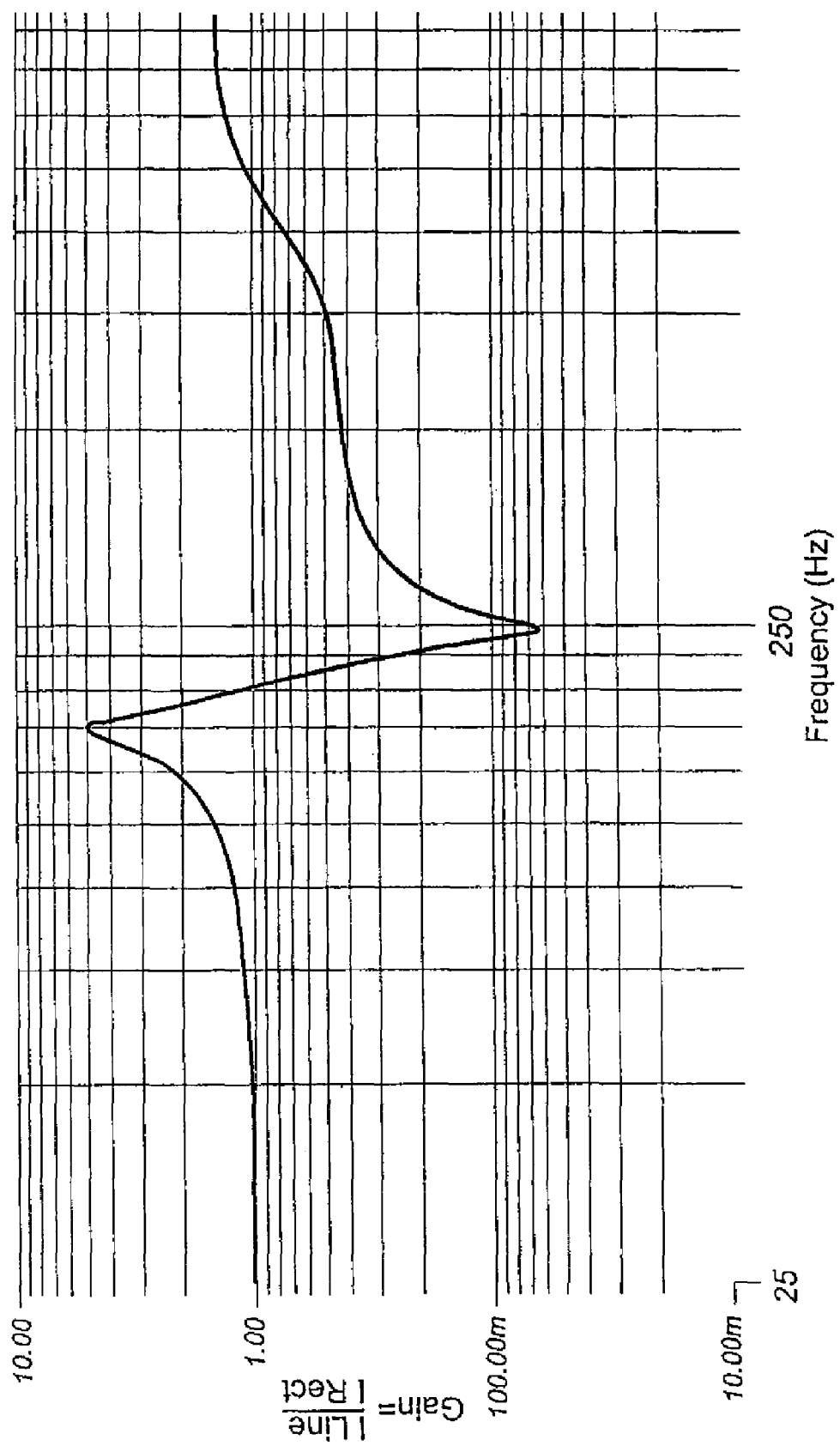
FIG. 11 is a frequency characteristic diagram showing the gain of the harmonic filter of FIG. 10 as a function of the frequency, both illustrated on a logarithmic scale.
Figure 12:
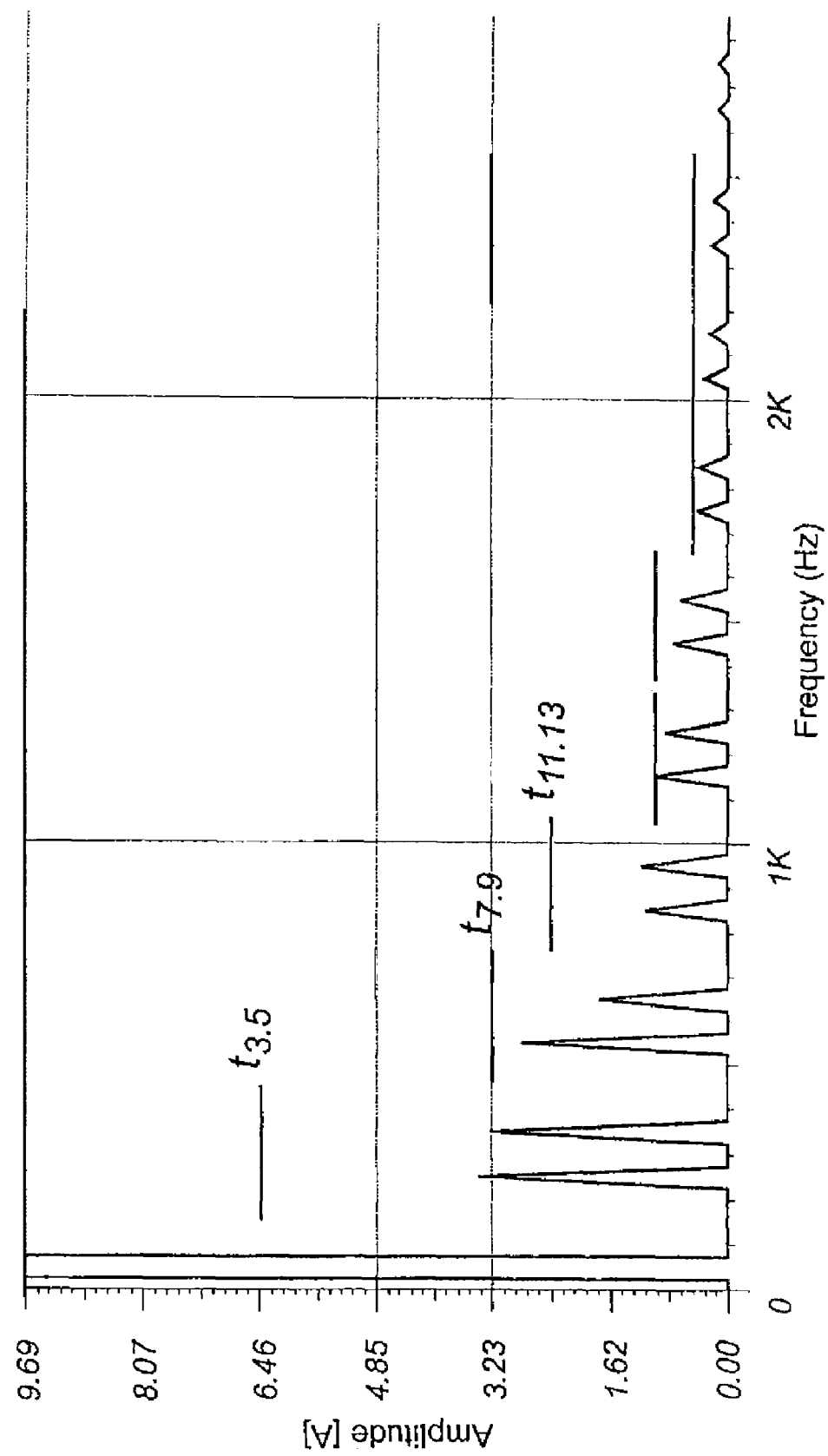
FIG. 12 is a graph showing the amplitude of the current at each harmonic for the harmonic filter of FIG. 10 as a function of the frequency illustrated on a linear scale.
Figure 14:
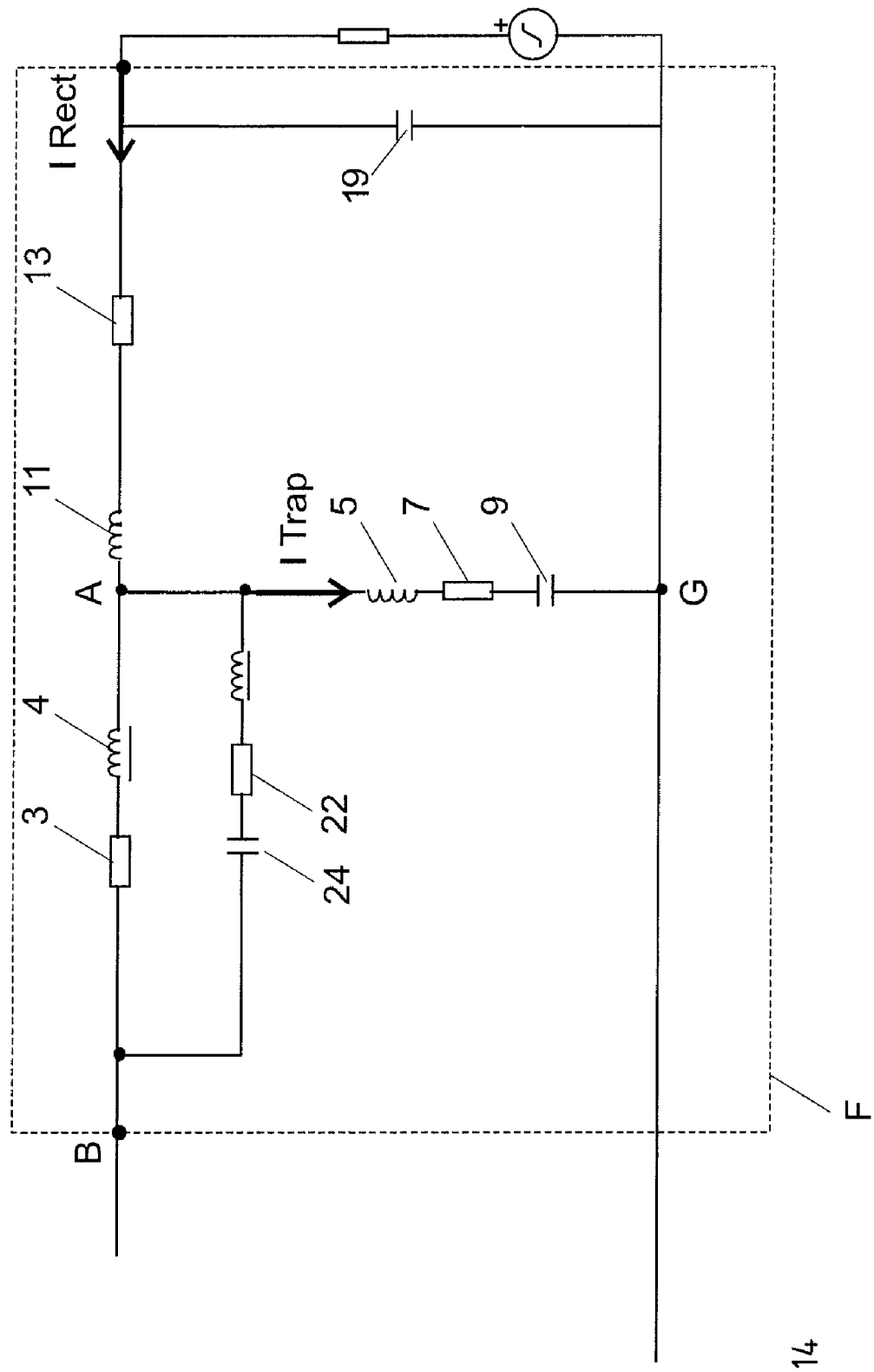
FIG. 14 shows the system of FIG. 7, where the damping circuit comprises an inductance.

FIG. 10 illustrates a system comprising the harmonic filter of FIG. 7 mounted between a power supply 1 and a load 15, 17, 19 comprising a capacitive part 19, for example a load that includes a low pass filter, such as a radiofrequency filter, between the harmonic filter and the non-linear load 15. In this case, the damping branch 22, 24 provides a bypass path avoiding some resonant circuits build between inductance 4 and some capacitors in the network. This reduces the part of the current $I_{Line}$ that goes through the inductance 4 in the first branch, and thus reduces or cancels resonances caused by the capacitive part 19 of the load. The graph of FIG. 11 shows damping and shift of the resonance at higher frequencies, while FIG. 12 shows that attenuation of all harmonics, including the eleventh and higher harmonics, is still better than the minimal attenuation required by national and international standards. FIG. 14 shows the system of FIG. 7, where the damping circuit comprises an inductance.

Following values are typical for the various components of the Figures:

|  | Resistor 3: | parasitic resistance, less than |
| --- | --- | --- |
| 10Ω | Inductance 4: | between 100 and 2000 μH |
|  | Inductance 5: | between 100 and 2000 μH |
|  | Resistor 7: | parasitic resistance, less than |
| 10Ω | Capacitor 9: | between 100 and 1000 μF |
|  | Inductance 11: | between 100 and 1500 μH |
|  | Resistor 13: | parasitic resistance, less than |
| 10Ω | Resistor 22: | discrete component, between 1 and |
| 100Ω | Capacitor 24: | between 100 and 1000 μF |

In non illustrated, alternative embodiments, damping may be achieved by an additional damping path parallel to the load 15. This has however the drawback of an important current flowing through the resistor instead of flowing though the load 15, 17.

Figure 13:
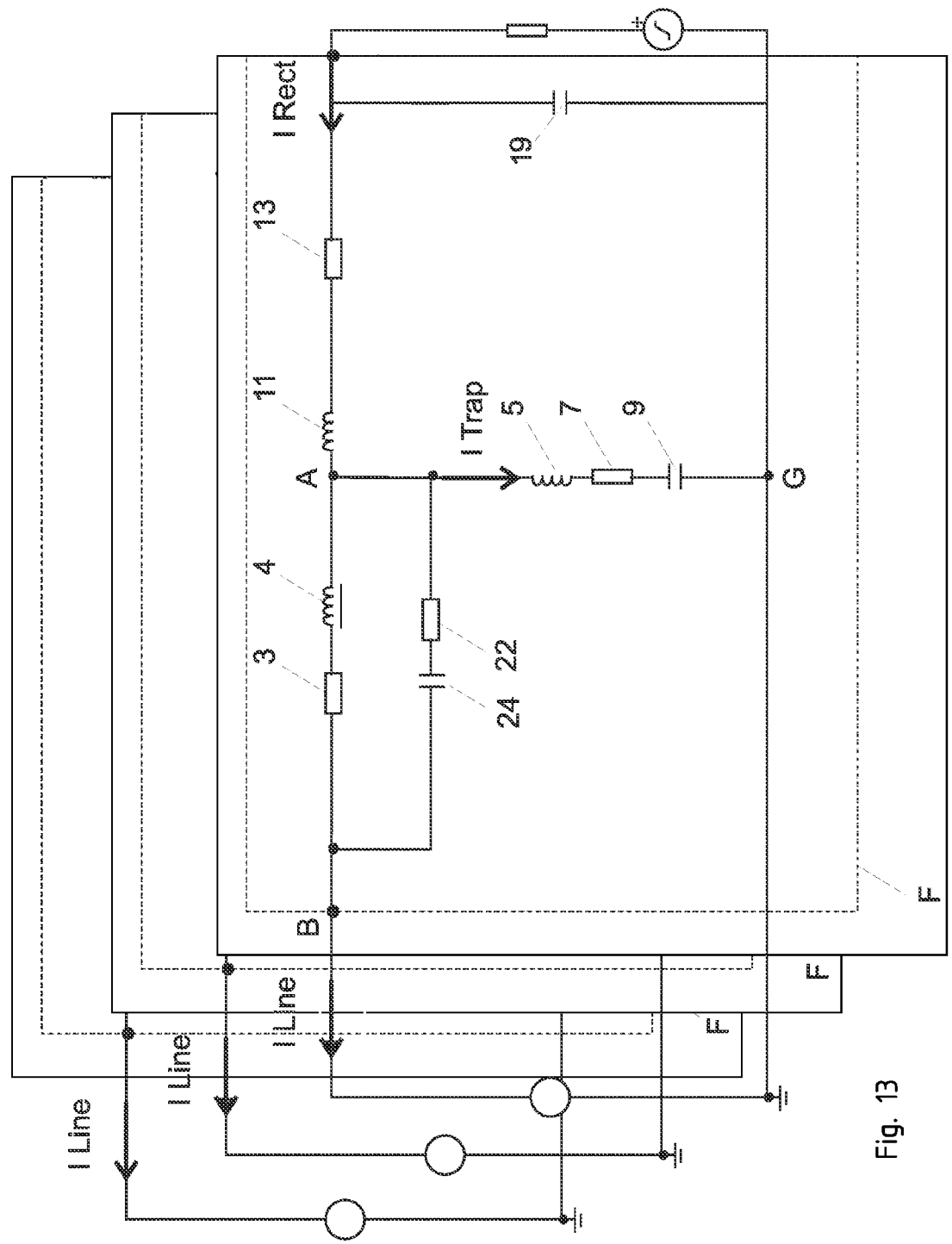
FIG. 13 shows a system comprising a harmonic filter having an inductor in series with a first resister and three identical passive harmonic filters between each phase and ground of a three-phase system.

FIGS. 1-12 show single-phase harmonic filters between a phase and the ground. However, this circuit is especially adapted to three phase systems, and usually used in such a three phase system without neutral; in this case, one arrangement according to any of the figures may be mounted between each phase R, S, T and the artificial neutral (center star node), as shown for instance in FIG. 13.

The invention also relates to a system comprising a harmonic filter connected to a radiofrequency filter at the output, and to a combined harmonic/radiofrequency filter that acts between both types of perturbations. The invention also relates to a radiofrequency filter comprising one damping branch arranged for damping resonant currents when the radiofrequency filter is connected at the output of a harmonic filter.

The invention claimed is:

1. A passive harmonic filter comprising:
   an input node for connection to an AC power supply;
   an output node for connection to a load;
   an intermediate node;
   a first branch between said input node and said intermediate node, said first branch comprising at least one first inductance;
   a second branch between said intermediate node and said output node, said second branch comprising at least one second inductance;
   a third branch between said intermediate node and a ground conductor, and comprising at least one capacitor;
   said first, second and third branch thus building a low-pass T-filter;
   a damping branch comprising at least one first resistor and one second capacitor serially connected to said first resistor, said damping branch being arranged in parallel to said first branch.

2. The passive harmonic filter of claim 1, said damping branch building with said third branch a high pass filter.

3. The passive harmonic filter of claim 1, said first inductance comprising a first coil with a first core, said damping branch comprising an inductance comprising a second coil with a second core distinct from said first core.

4. The passive harmonic filter of claim 3, wherein a material of said first core is different from a material of said second core.

5. The passive harmonic filter of claim 3, wherein attenuation caused by said first core at frequencies higher than a fundamental frequency is higher than attenuation caused at those higher frequencies by said second core.

6. The passive harmonic filter of claim 1 being a single phase filter.

7. Three-phase harmonic filter comprising one passive harmonic filter of claim 1 between each phase and the ground conductor.

8. System comprising a harmonic filter according to claim 1 and a RFI filter between the harmonic filter and the load.

9. System comprising:
   a T-type low pass harmonic filter;
   a low pass radiofrequency filter at the output of said harmonic filter,
   said low pass radiofrequency filter building with said harmonic filter a LC resonant loop,
   a damping branch for bypassing said resonant loop, said damping branch comprising at least one first resistor and one second capacitor serially connected to said first resistor.

10. The system of claim 9, wherein the system has an attenuation for at least the fifth, seventh and eleventh harmonic of a mains frequency.

11. The system of claim 9, wherein the system has an attenuation for a harmonics of a mains frequencies at or less than about 660 Hz.

12. A passive harmonic filter comprising:

an input node for connection to an AC power supply;

an output node for connection to a load;

an intermediate node;

a first branch between said input node and said intermediate node, said first branch comprising at least one first inductance with a first coil having a first core;

a second branch between said intermediate node and said output node, said second branch comprising at least one second inductance;

a third branch between said intermediate node and a ground conductor, and comprising at least one capacitor; said first, second and third branch thus building a low-pass T-filter;

a damping branch comprising at least one first resistor and one second capacitor serially connected to said first resistor, and an inductance comprising a second coil with a second core distinct from said first core, the attenuation caused by said first core at frequencies higher than a fundamental frequency being higher than the attenuation caused at those higher frequencies by said second core, said damping branch being arranged in parallel to said first branch.

* * * * *